July 12, 1966 F. F. OFFNER 3,260,955
DIFFERENTIAL AMPLIFIER
Original Filed Feb. 2, 1959
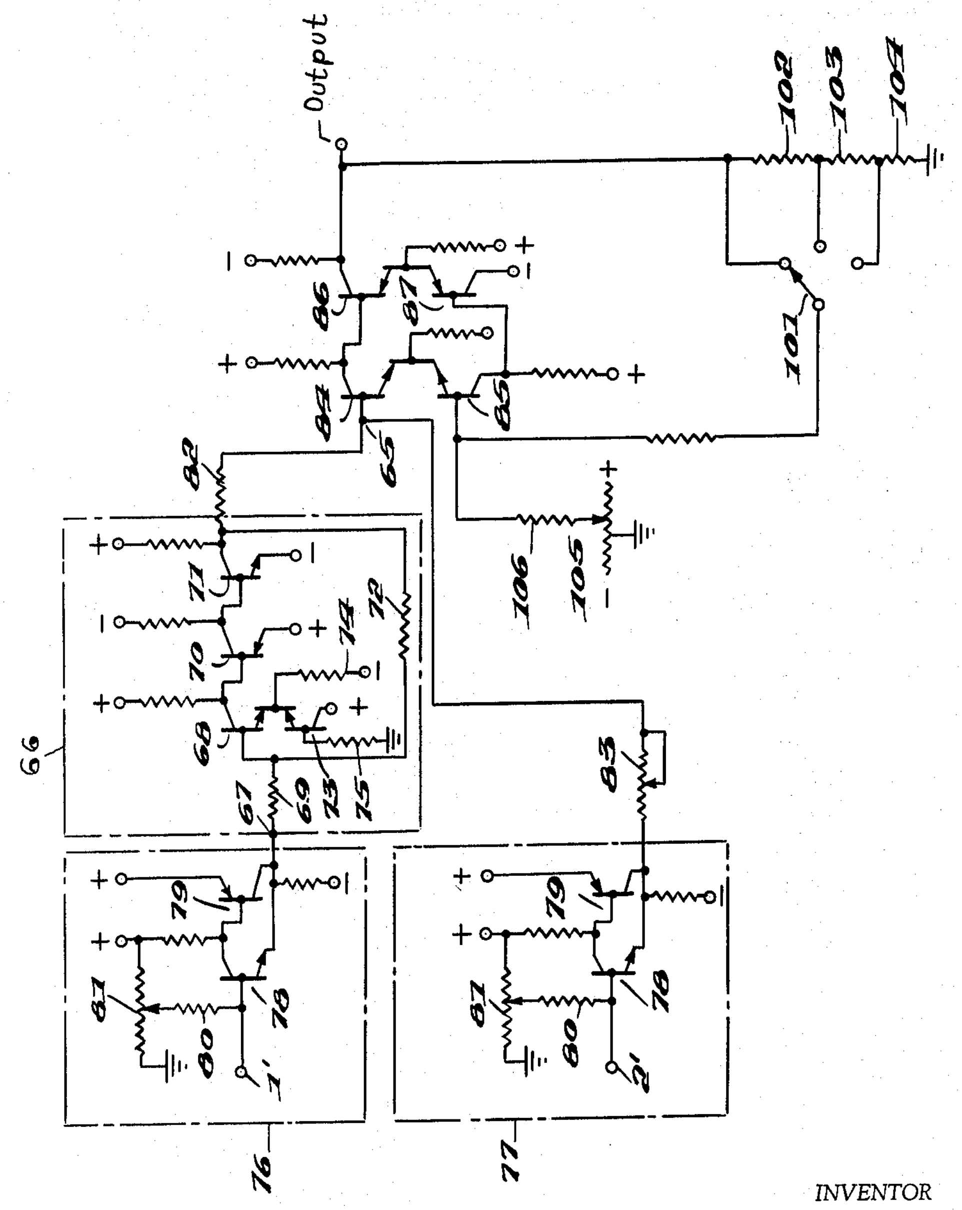
INVENTOR
FRANKLIN F. OFFNER,
BY Pierce, Scheffler & Parker
ATTORNEYS United States Patent Office 3,260,955
Patented July 12, 1966

3,260,955
DIFFERENTIAL AMPLIFIER
Franklin F. Offner, 1890 Telegraph Road, Deerfield, Ill.
Original application Feb. 2, 1959, Ser. No. 790,498. Divided and this application May 28, 1964, Ser. No. 370,883
3 Claims. (Cl. 330—69)

This invention relates to electrical ammplifiers of the differential type, and this particular application is a division of my co-pending application Serial No. 790,498 filed February 2, 1959, now abandoned.

Differential amplifiers of various types have already been developed and typical of these are the arrangements disclosed in my previously granted United States Patents Nos. 2,931,985, 2,954,529, 3,018,444 and 3,079,565.

An object of the present invention is to provide a further improved amplifier of the differential type having a high degree of accuracy in the amplification itself while using only single-ended, individual amplifier sections. One suitable embodiment of the invention is illustrated in the accompanying drawing which is an electrical schematic.

With reference now to the circuit shown in the drawing, differential action is obtained by adding the input signal applied between terminal 1′ and ground of amplifier 76, in reverse phase to the input signal applied between terminal 2′ and ground of amplifier 77. The signal appearing at terminal 65 is equal to one-half the sum of these two signals. The reversal of phase of the signal applied at terminal 1′ is accomplished through phase reversing amplifier 66. The input signal to this amplifier, as developed in point 67, is applied to the input base of transistor 68 through resistor 69. There are a total of three transistor stages 68, 70 and 71, directly coupled, of alternate PNP and NPN type in amplifier 66. Since each stage reverses the phase, after three stages the phase is reversed at the output from the input. Resistor 72 feeds back the output signal to the input base of transistor 68. The gain of this amplifier is sufficiently high so that the feedback signal to the input is sufficient to maintain the input base at a substantially constant potential, as the signal is varied at point 67. That is, if resistors 69 and 72 are of equal value, the output signals at the collector of transistor 71 will be practically identical in amplitude, but opposite in phase, to the signal applied at point 67. It will be seen that under these conditions, the sum of the two signals is equal to zero at the input to transistor 68. This circuit thus acts to reverse the phase of the signal at point 67.

The function of transistor 73 is to prevent changes in ambient temperature from causing a shift in the output of amplifier 66. Temperature has been found to have two effects upon the functioning of a transistor. One such effect is to increase the leakage current from base to collector. This current will double approximately every 10° C. The second effect is to change the base-to-emitter voltage required for a given collector circuit. This voltage changes approximately five millivolts for every degree centigrade. Both of these effects may be substantially cancelled by the use of an auxiliary balancing transistor 73. The latter should be similar to transistor 68, and particularly, it should have closely the same value of leakage current. Resistor 74 is connected at one end thereof to the common emitter point of transistors 68 and 75 and at the other end to a source of negative potential. Resistor 74 is made relatively large, and if the negative potential applied is sufficient to maintain the common emitter point at the desired potential, then its emitter will take on a potential negative with respect to ground, as required, to maintain the proper current through resistor 74. If the ambient temperature changes, the emitter-to-base potential of transistor 73 will correspondingly change the required amount to maintain this current substantially constant. This then changes the potential at which the emitter of transistor 68 is maintained, changing it by the amount required to maintain the current through its emitter circuit, also constant. Resistor 75 is added in the base circuit of transistor 73, to provide compensation for the changes in leakage current. If the leakage currents of transistors 73 and 68 are equal, then if resistors 69 and 75 are also equal, the change in base voltage of transistor 68 is matched by that of transistor 73. However, an increase in the base voltage of transistor 73 must be matched by an equal change in the emitter voltage, to maintain the emitter-base potential at a constant value. This also causes a simultaneous change in the emitter voltage of transistor 68, which thus cancels out the change which occurred in the base voltage of transistor 68, as a result of the leakage current change through resistor 69. Thus, both effects of temperature on transistor 68 are effectively cancelled by transistor 73.

Amplifiers 76 and 77 are similar to one another. Their function is to isolate the two input terminals effectively from their outputs, and to provide a high input impedance for the amplifier 66. Each of the amplifier sections 76 and 77 is a two-stage amplifier with unity negative feedback. Each amplifier section has an NPN input transistor 78, directly coupled to PNP output transistor 79. The emitter of transistor 78 is connected to the collector of transistor 79, giving the desired unity feedback. The result is substantially unity voltage gain, but with a current gain equal to the product of the current gain of the two transistors. This may be approximately 5,000. As a result, the input impedance, looking into the base of transistor 78 will be approximately 5,000 times the load in the collector circuit of transistor 79.

To obtain the proper collector operating current in transistor 78, a base current equal approximately to the collector current divided by the current gain of the transistor, must be employed. To provide this current, high value resistor 80 is connected from the base of transistor 78 to an adjustable source of positive potential, provided by variable potentiometer resistor 81. This latter resistor is so adjusted that the voltage at input terminal 1′ is substantially zero, when the output at point 67 is zero. A similar circuit is employed in the amplifier section 77 with regard to input terminal 2′.

The output of amplifier 66 and the output of amplifier 77 are added through adding resistors 82 and 83 which are of substantially equal value. However, one of them, for example, resistor 83, may be made variable to ensure that the voltage at point 65, resulting from the application of a signal of a given magnitude at input terminal 1′, is exactly equal and opposite to that resulting from the application of an equal signal at input terminal 2′.

The signal existing at point 65 is further amplified by a plurality of additional transistor stages. The first of these stages consists of transistors 84 and 85 connected in a balanced input circuit, to provide the same temperature compensating action as was provided by transistors 68 and 73 in amplifier 66. The output at this first stage is directly coupled to the second stage consisting of transistors 86 and 87, again connected in the same manner to further ensure temperature stability. The output from this second stage is taken from the collector of transistor 86, to ground.

Feedback is taken from the output terminal legended "Output," and connected to resistors 102, 103, 104 in series to ground. The desired feedback ratio is obtained by selecting the fraction of the total output voltage by switch 101.

It will be recognized that, in the above described circuit, in all cases, the position of NPN and PNP transistors could be interchanged by interchanging only the potentials of the power supply. However, it has been found that NPN type transistors are desirable at the places indicated, since it is possible to produce NPN transistors having a leakage current of lower than one microampere. This is desirable from the standpoint of stability, in order to avoid the need for balancing out large leakage current effects.

It will be seen that this invention provides a differential amplifier having desirable characteristics as to balance, frequency response, and stability. While it has been illustrated in one embodiment, it should be clear that the invention is broadly applicable. For example, while unity gain input summing amplifiers are shown, these amplifiers could have gains either greater or less than unity, provided only that at the summing points the gains are equal and opposite.

I claim:

1. In an apparatus for providing amplification for the difference between first and second signal components of a common direct current input signal, the combination comprising means applying said signal components respectively between a first input terminal and a reference terminal and between a second input terminal and said reference terminal, a first signal amplifier transmitting means for transmitting said first signal component without changing the phase thereof, second signal amplifier transmitting means for transmitting said second signal component and which includes means reversing the phase thereof, said first and second signal amplifier transmitting means being characterized by having their respective signal transmissions dependent substantially only upon resistance values and independent of amplification element characteristics, resistance summing means connected to the outputs of said first and said second amplifier transmitting means and which includes a summing point, and further amplifying means connected to said summing point on said resistance summing means.

2. A direct current amplifier as defined in claim 1 wherein said resistance summing means is in inverse proportion to the transmission factors of said first and second signal amplifier transmitting means thereby resulting in a summed signal proportional to the difference between said first and second transmitted signal components.

3. In an apparatus for providing amplification for the difference between first and second signal components of a common direct current input signal, the combination comprising, means applying said signal components respectively between a first input terminal and a reference terminal and between a second input terminal and said reference terminal, a first signal amplifier transmitting means for transmitting said first signal component without changing the phase thereof, second signal amplifier transmitting means for transmitting said second signal component and which includes means reversing the phase thereof, said first and second signal amplifier transmitting means being characterized by having their respective signal transmissions dependent substantially only upon resistance values and independent of amplification element characteristics and said second signal amplifying transmitting means including a signal amplifying inversion section having an inverse feedback of such ratio as to make its amplification substantially independent of the amplifier characteristics, resistance summing means connected to the outputs of said first and second signal amplifier transmitting means and which includes a summing point, said summing means being in inverse proportion to the transmission factors of said first and second signal transmitting means thus producing at said summing point a summed signal proportional to the difference between said first and second transmitted signal components, and further amplification means connected to said summing point on said summing means for giving an amplified signal proportional to the difference between said first and second transmitted signal components.

References Cited by the Examiner

UNITED STATES PATENTS

| | | | |
|---|---|---|---|
| 2,761,019 | 8/1956 | Hall | 330—69 X |
| 2,923,888 | 2/1960 | Buesing | 330—147 X |
| 3,085,209 | 4/1963 | Carlson | 330—69 X |

ROY LAKE, *Primary Examiner.*

NATHAN KAUFMAN, *Examiner.*